United States Patent
Bae et al.

(10) Patent No.: US 8,917,116 B2
(45) Date of Patent: Dec. 23, 2014

(54) PHASE INTERPOLATOR BASED OUTPUT WAVEFORM SYNTHESIZER FOR LOW-POWER BROADBAND TRANSMITTER

(71) Applicant: TeraSquare Co., Ltd., Seoul (KR)

(72) Inventors: Hyeon Min Bae, Seoul (KR); Tae Hun Yoon, Daejeon (KR); Jong Hyeok Yoon, Seoul (KR)

(73) Assignee: TeraSquare Co., Ltd., Seoul (KR)

( * ) Notice: Subject to any disclaimer, the term of this patent is extended or adjusted under 35 U.S.C. 154(b) by 0 days.

(21) Appl. No.: 13/843,054

(22) Filed: Mar. 15, 2013

(65) Prior Publication Data
US 2014/0266318 A1    Sep. 18, 2014

(51) Int. Cl.
*H03H 11/16*    (2006.01)

(52) U.S. Cl.
USPC ........... 327/105; 327/231; 327/234; 327/246; 327/247

(58) Field of Classification Search
USPC .......................... 327/105, 231–235, 246–247
See application file for complete search history.

(56) References Cited

U.S. PATENT DOCUMENTS

| | | | | |
|---|---|---|---|---|
| 6,943,606 B2 * | 9/2005 | Dunning et al. | ............... | 327/231 |
| 7,425,856 B2 * | 9/2008 | Abel et al. | ..................... | 327/231 |
| 7,812,648 B2 * | 10/2010 | Wood | ............................ | 327/117 |

* cited by examiner

*Primary Examiner* — Kenneth B. Wells
(74) *Attorney, Agent, or Firm* — Blakely, Sokoloff, Taylor & Zafman LLP

(57) ABSTRACT

Exemplary embodiments of the present invention relate to an output waveform synthesizer using phase interpolators and an on-chip eye opening monitoring (EOM) circuit for a low-power transmitter. In order to achieve both small area and low-power consumption in the transmitter design, a single-stage multiphase multiplexer operating in subrate is employed. The multiphase multiplexer is composed of parallelized open-drain NAND gates. In subrate transmitter architecture, the phase mismatch among multiphase clock signals degrades jitter performance significantly and is a critical bottleneck for its widespread use despite low power consumption. In order to overcome such mismatch problem, an area-and-power-efficient phase interpolator based waveform synthesizing scheme is developed.

6 Claims, 11 Drawing Sheets

US 8,917,116 B2

PHASE INTERPOLATOR BASED OUTPUT WAVEFORM SYNTHESIZER FOR LOW-POWER BROADBAND TRANSMITTER

BACKGROUND OF THE INVENTION

1. Field of the Invention

Exemplary embodiments of the present invention relate to an output waveform synthesizer using phase interpolators and an on-chip eye opening monitoring (EOM) circuit for a low-power transmitter.

2. Discussion of the Background

FIG. 1 shows a simplified circuit schematic diagram of a conventional multiphase multiplexer, and FIG. 2 shows a simplified timing diagram of a conventional multiphase multiplexer. The outputs are evaluated when two neighboring clock phases overlap. However, the deterministic jitter (DJ) caused by phase mismatch dominates the overall jitter performance of a multiphase multiplexer. FIG. 3 show an output eye diagram with phase mismatch and duty cycle distortion. The DJ shown in FIG. 3 eventually degrades the timing margin at the receiver. The phase mismatch is caused by inherent device mismatch and capacitance mismatch in a layout. The output eye diagram shows a result of Monte-Carlo simulation as probability distributions of a process parameter for each of two hundred samples and shows different eye diagrams for the probability distributions are caused by the phase mismatch or the duty cycle variation.

SUMMARY OF THE INVENTION

An exemplary embodiment of the present invention discloses an output waveform synthesizer for low-power broadband transmitter, the output waveform synthesizer comprises a 2N number of phase interpolators configured to control rising and falling edges of a N number of different phase clock signals generated by a clock generator, N being a positive even number, wherein an N number of outputs of the 2N number of phase interpolators are inputted as clock signals of an N-to-1 multiplexer.

An n-th clock signal of the N number of different phase clock signals has $((n-1)*(2\pi/N))$ phase, and n is a natural number between 1 and N.

The 2N number of phase interpolators classified into N number of groups, and all of the n-th clock signal and (n+1)-th clock signal are inputted to each of two phase interpolators included in n-th group of the N number of groups.

Two outputs of the two phase interpolators are used as a single phase clock with independently controllable rise and fall delays.

The 2N number of phase interpolators further configured to adjust at least one of clock overlap periods and phase alignments among the N number of different phase clock signals.

The output waveform synthesizer further comprises an eye open monitoring unit configured to measure an output of an output driver to quantitatively measure a signal eve diagram of an output of the N-to-1 multiplexer, and a micro controller unit configured to receive the measured signal eye diagram and update phase control codes of the 2N number of phase interpolators using the measured signal eye diagram and a pre-defined calibration algorithm.

The 2N number of phase interpolators and the eve open monitoring unit are included in a chip including the N-to-1 multiplexer and the clock generator, and the micro controller unit is connected to the 2N number of phase interpolators and the eve open monitoring unit, outside of the chip.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION

Figure 1:
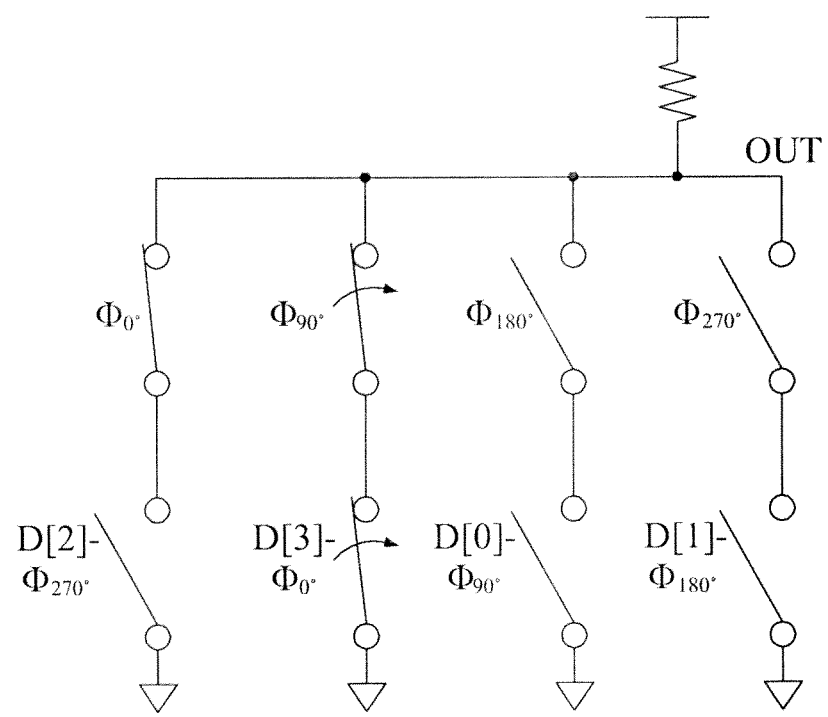
FIG. 1 shows a simplified circuit schematic diagram of a conventional multiphase multiplexer.
Figure 2:
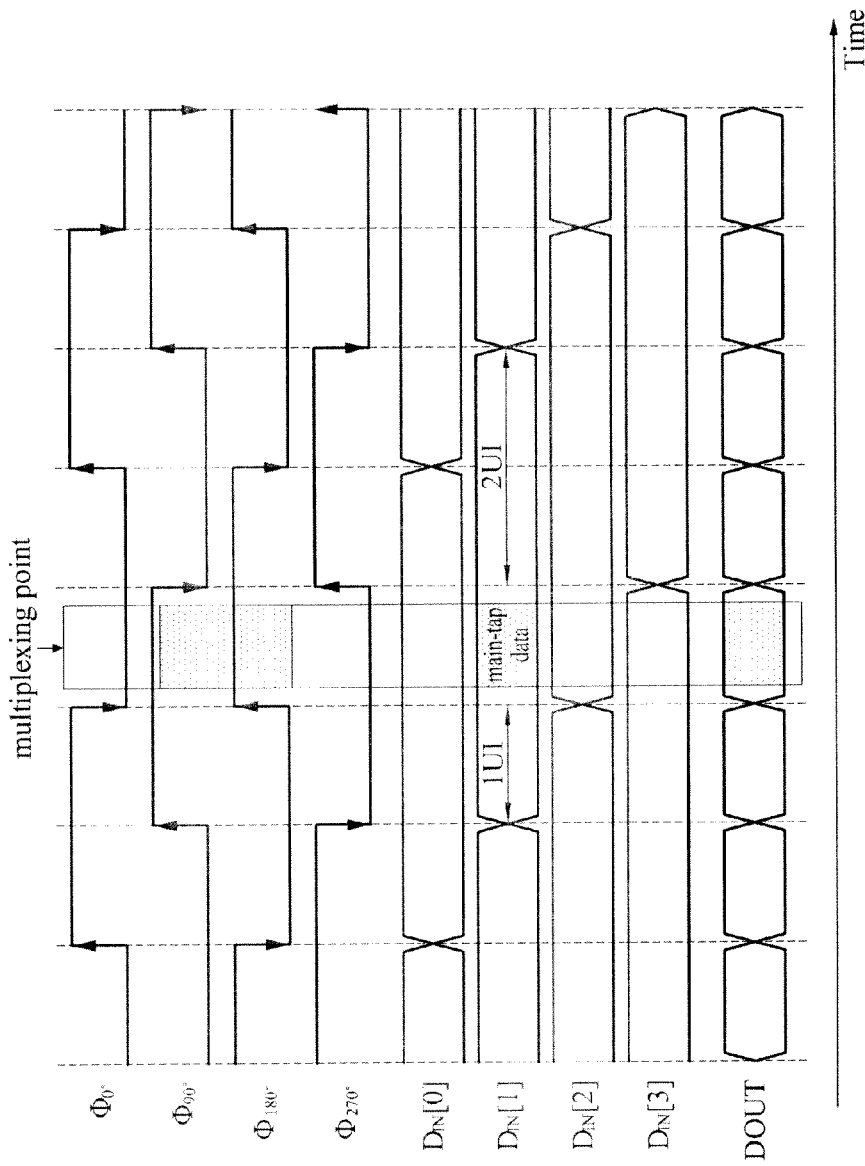
FIG. 2 shows a simplified timing diagram of a conventional multiphase multiplexer.
Figure 3:
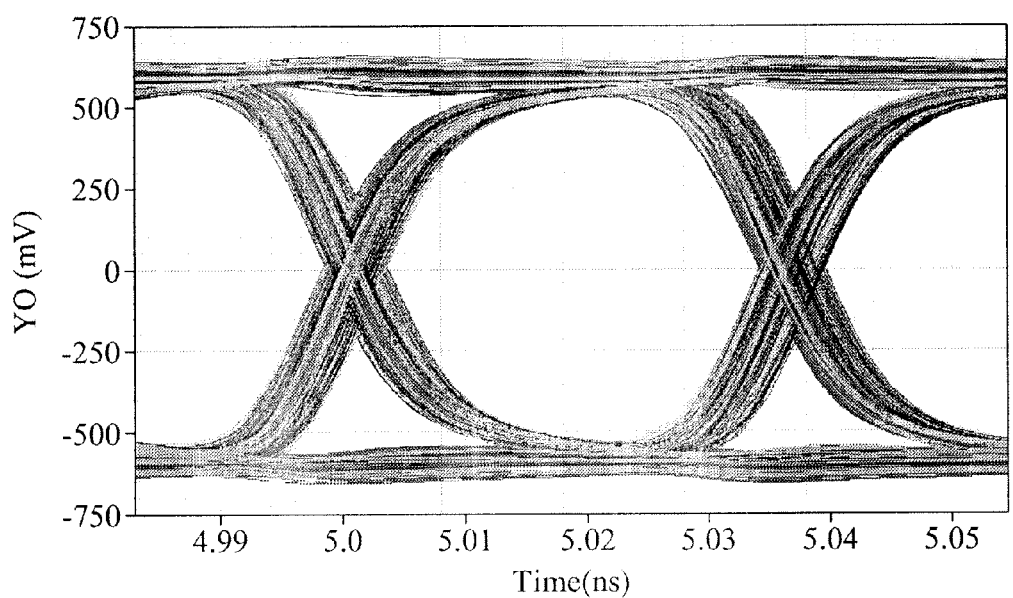
FIG. 3 show an output eye diagram with phase mismatch and duty cycle distortion.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

In order to overcome the phase mismatch problems, an output waveform synthesizer based on phase interpolators (PI) is suggested. Since the entire waveform control is performed in the subrate clock domain using PIs, the power overhead is negligible.

Figure 4:
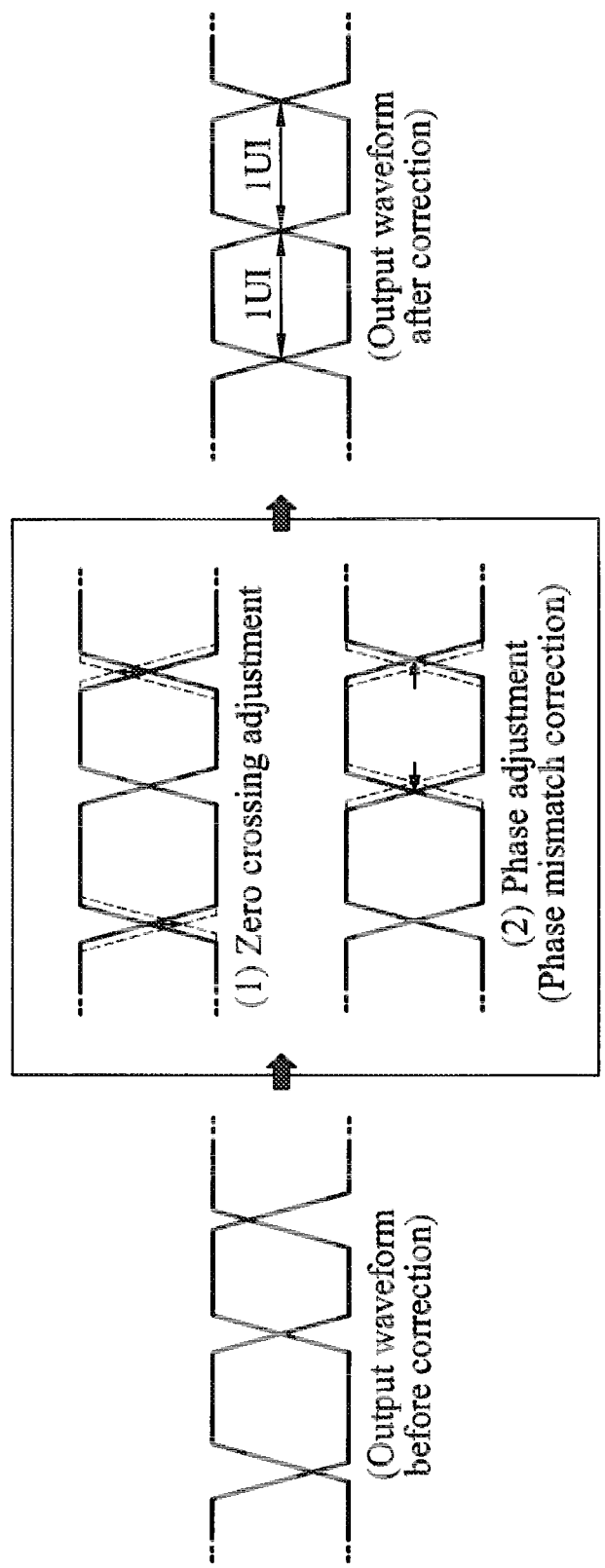
FIG. 4 is a view illustrating an example of correcting an output waveform using the waveform synthesizer according to an exemplary embodiment of the present invention.

FIG. 4 is a view illustrating an example of correcting an output waveform using the waveform synthesizer according to an exemplary embodiment of the present invention. The waveform control is performed in two steps as shown in FIG. 4: 1) zero crossing adjustment, 2) phase adjustment. Nonideal zero crossing points are caused when two adjacent branches are turned on/off simultaneously. Increased zero crossing occurs when two neighboring branches are turned off concurrently. Likewise, decreased zero crossing happens with the simultaneous activation. The duty cycle mismatch occurs when the activation time of each branch is unbalanced due to phase mismatches among multiphase clock signals. "1UI"

denotes one unit interval. Therefore, an interval of the multiphase clock signals may adjust according to the "1UI" at the step of phase adjustment.

Figure 5:
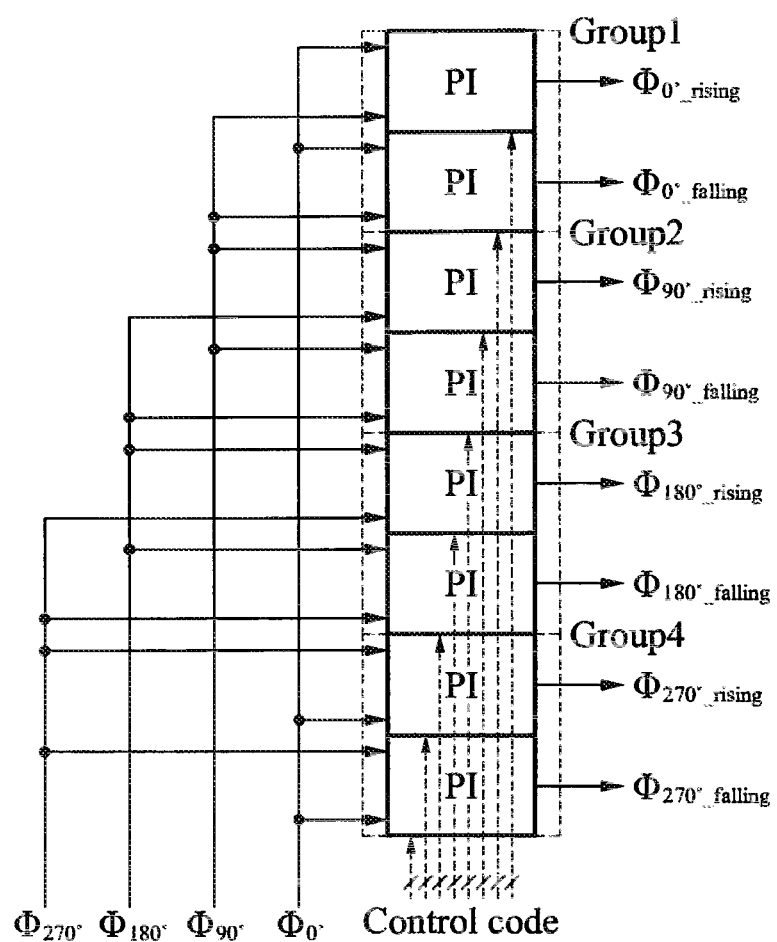
FIG. 5 is a view illustrating an example of correcting an output waveform using the waveform synthesizer according to an exemplary embodiment of the present invention.

FIG. 5 is a view illustrating an example of correcting an output waveform using the waveform synthesizer according to an exemplary embodiment of the present invention. In order to adjust the zero crossing and duty cycle of the output waveform, rising and falling edges of each clock phase should be controlled independently. For example, eight PIs divided into four groups are employed as shown in FIG. 5. Eight PIs interpolate four clock phases from the clock generator and produce eight independent phase clock signals.

The four clock phases are adjusted using eye information obtained with respect to each of the four clock phases from an eye open monitoring circuit "EOM". For the zero crossing adjustment, PIs adjust the falling edges by calibrating corresponding phases of the falling edges to prevent two adjacent branches from being turned on/off simultaneously. Then, a control code for calibration of the falling edges may be obtained. Also, the eight PIs adjust the falling edges and the rising edges by calibrating corresponding phases of the falling edges and the rising edges. A control code for the rising edges may be increased or decreased for correction of a difference of phases of rising edges and may be added to the obtained control code for the falling edges. For example, the PIs adjust the falling edges by controlling a calibration of a duty cycle of a clock so that a ratio of the duty cycle is corrected as 50 percent. Thereafter, the eight PIs may control both the rising edges and the falling edges to adjust the interval of each phase of the multiphase clock signals.

Figure 6:
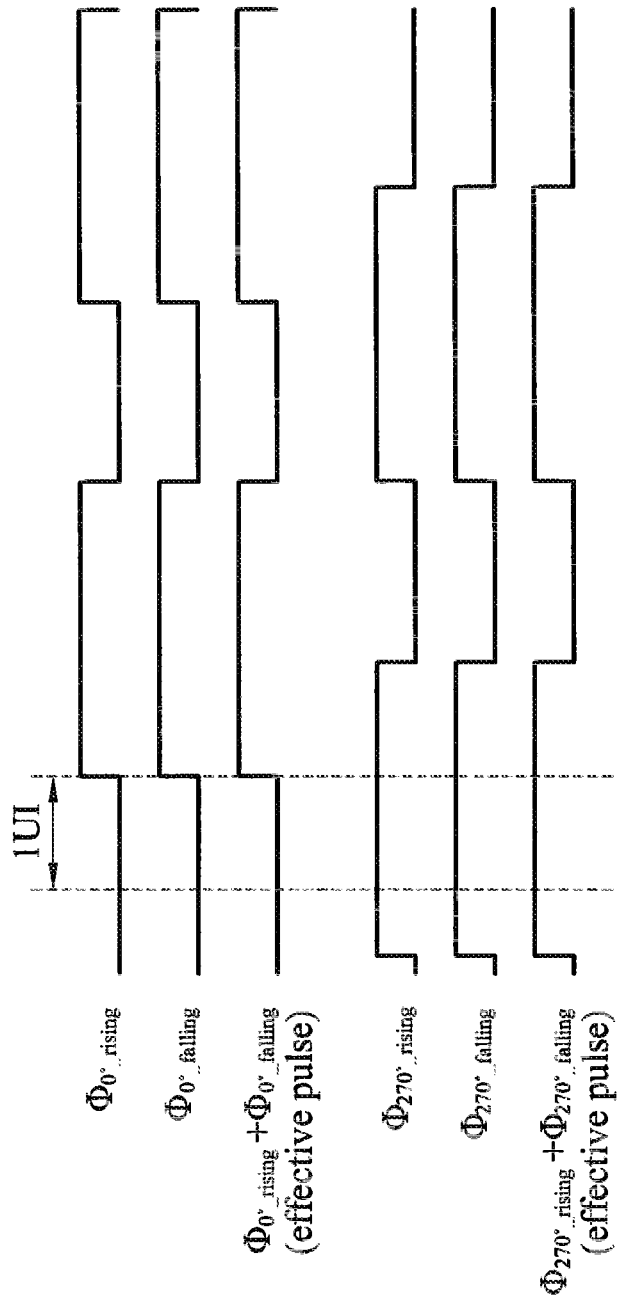
FIG. 6, FIG. 7 and FIG. 8 show an example of phase mismatch calibration according to an exemplary embodiment of the present invention.
Figure 7:
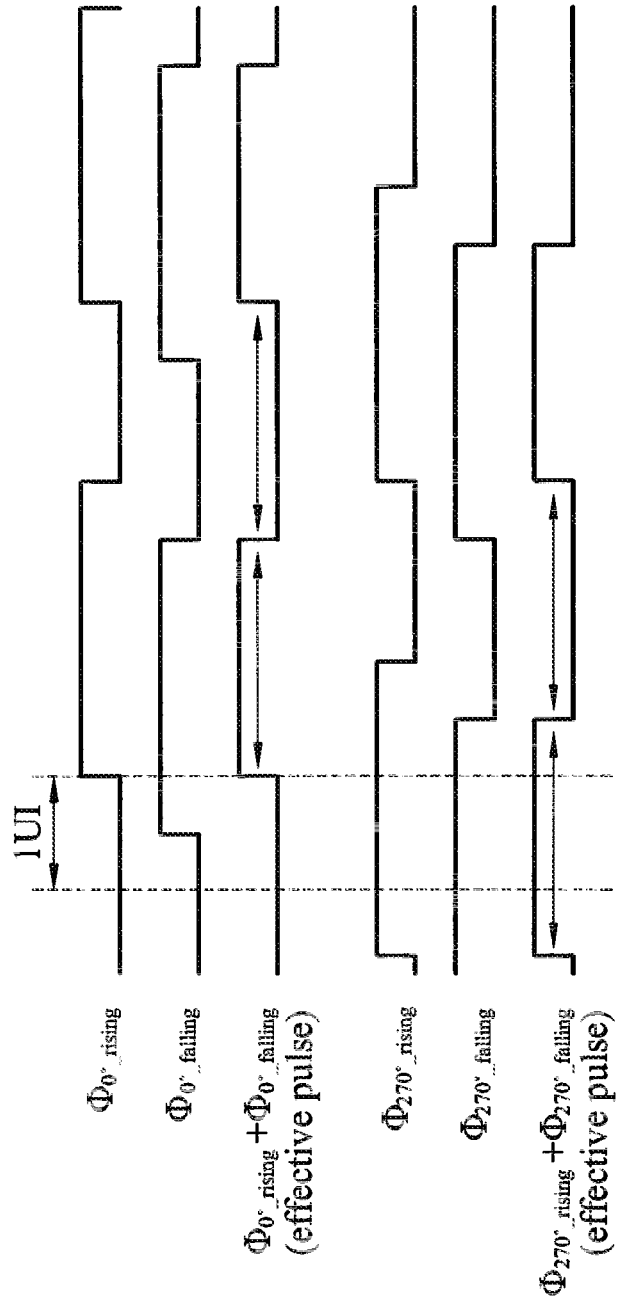
Figure 8:
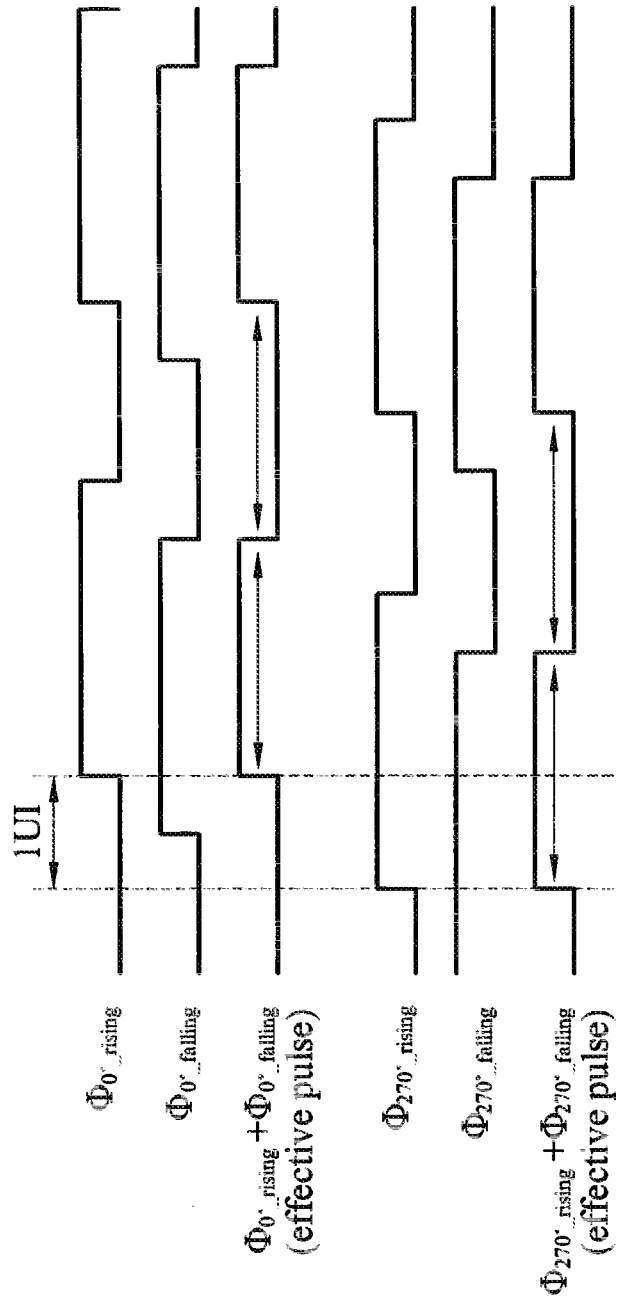

FIG. 6, FIG. 7 and FIG. 8 show an example of phase mismatch calibration according to an exemplary embodiment of the present invention. FIG. 6 shows a timing diagram when the ratio of the duty cycle is bigger than 50 percent and an interval of the phases is bigger than the "1UI". FIG. 7 shows a timing diagram where the ratio of the duty cycle corrects as 50 percent. However, the interval of the phases is not "1UI". FIG. 8 shows a timing diagram where an interval of phases of a rising edge and a falling edge with 270 degrees so that the ratio of the duty cycle may correct as 50 percent and the interval of the phases may be adjusted as "1UI".

Figure 9:
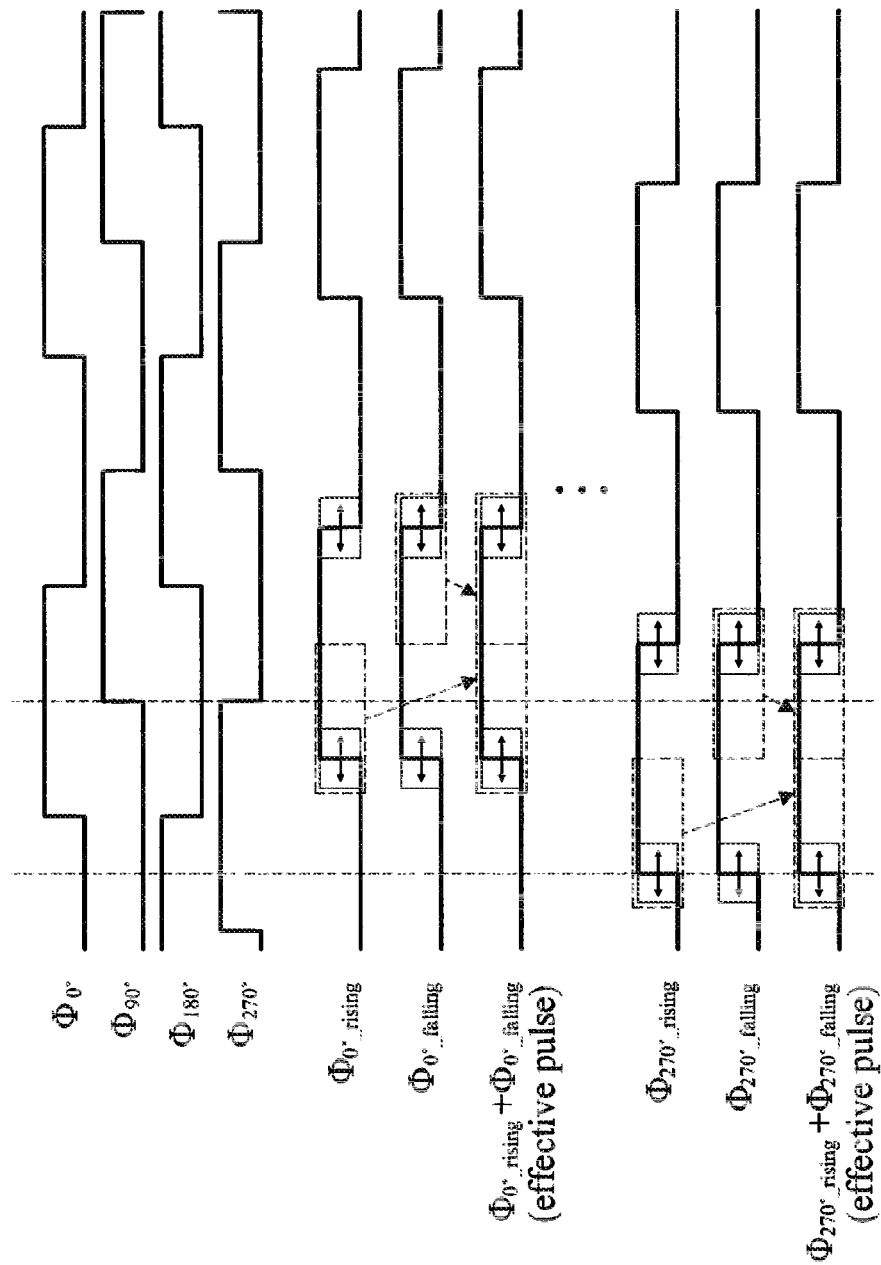
FIG. 9 is a view illustrating an example of phase interpolation method for independently controllable rise and fall delays according to an exemplary embodiment of the present invention.

FIG. 9 is a view illustrating an example of a phase interpolation method for independently controllable rise and fall delays according to an exemplary embodiment of the present invention. Two output clocks from each group as shown in FIG. 5 are equivalent to a single phase clock with independently controllable rise and fall delays as shown in FIG. 9. It is because only the half period including the rising edge affects the operation of one branch and the other half including the falling edge affects the other.

Figure 10:
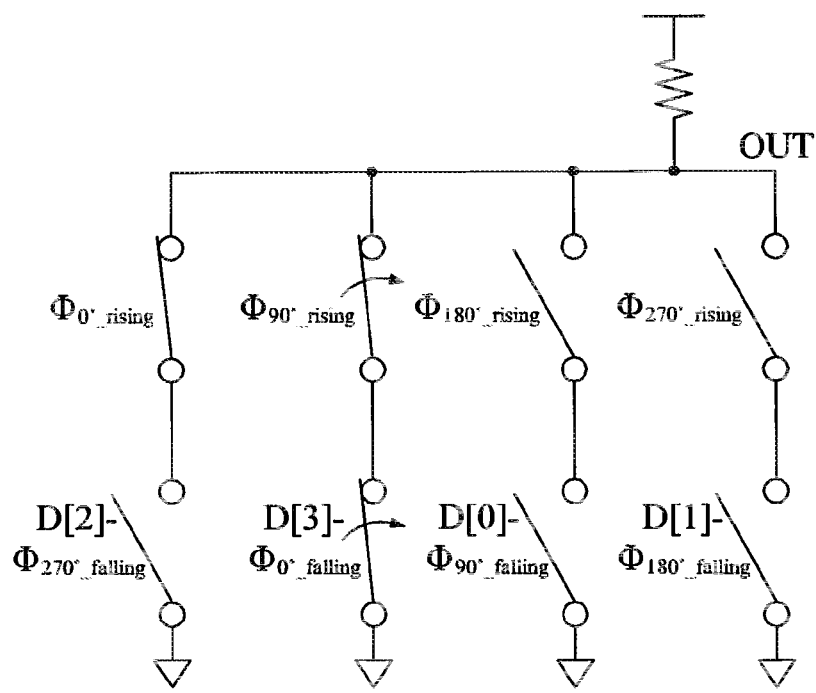
FIG. 10 is a view illustrating an example of a modified four-phase multiplexer for the output waveform synthesizer according to an exemplary embodiment of the present invention.

FIG. 10 is a view illustrating an example of a modified four-phase multiplexer for the output waveform synthesizer according to an exemplary embodiment of the present invention. It can overcome all potential DJs caused by various mismatches. In addition, pattern dependent output waveform shaping can be easily achieved by controlling the interpolation factors.

Figure 11:
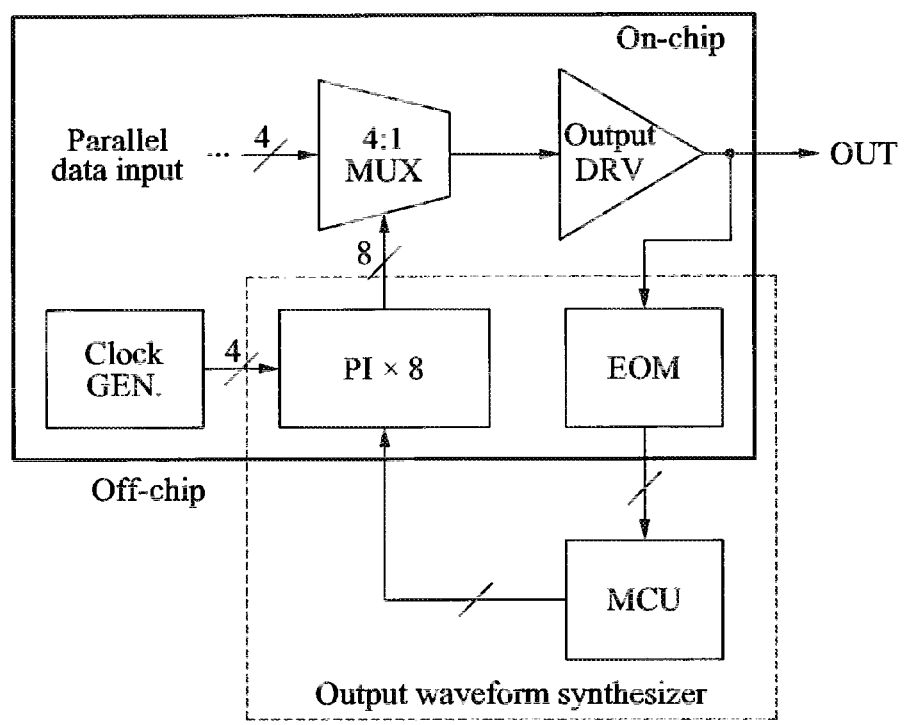
FIG. 11 is a view illustrating an example of a system level block diagram of the output waveform synthesizer according to an exemplary embodiment of the present invention.

FIG. 11 is a view illustrating an example of a system level block diagram of the output waveform synthesizer according to an exemplary embodiment of the present invention. The output waveform synthesizer consists of an on-chip eye open monitoring circuit "EOM", a plurality of PIs "PI×8", and an off-chip micro controller unit "MCU". During the power-on process, (MCU-controlled) output waveform calibration is executed once. Initially, an on-chip test pattern generator (TPG) transmits a test pattern to the serializer "4:1 MUX. Internal "EOM" circuit may measure an output of the output driver to quantitatively measure the signal eye diagram of the transmitted output and reports the measured signal eye diagram to the MCU. Then, the MCU updates the phase control codes of the PIs by using a pre-defined calibration algorithm. "Clock Gen" and "Output DRV" denote clock generator for generating the clock and output driver for generating the control signal.

The exemplary embodiments according to the present invention may be recorded in computer-readable media including program instructions to implement various operations embodied by a computer. The media may also include, alone or in combination with the program instructions, data files, data structures, and the like. The media and program instructions may be those specially designed and constructed for the purposes of the present invention, or they may be of the kind well-known and available to those having skill in the computer software arts.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An output waveform synthesizer for low-power broadband transmitter, the output waveform synthesizer comprising:
a 2N number of phase interpolators configured to control rising and falling edges of a N number of different phase clock signals generated by a clock generator, N being a positive even number, wherein an N number of outputs of the 2N number of phase interpolators are inputted as clock signals of an N-to-1 multiplexer;
an eye open monitoring unit configured to measure an output of an output driver to quantitatively measure a signal eye diagram of an output of the N-to-1 multiplexer; and
a micro controller unit configured to receive the measured signal eye diagram and update phase control codes of the 2N number of phase interpolators using the measured signal eye diagram and a pre-defined calibration algorithm.

2. The output waveform synthesizer of claim 1, wherein an n-th clock signal of the N number of different phase clock signals has $((n-1)*(2\pi/N))$ phase, and n is a natural number between 1 and N.

3. The output waveform synthesizer of claim 2, wherein the 2N number of phase interpolators are classified into N number of groups, and both of the n-th clock signal and (n+1)-th clock signal are inputted to each of two phase interpolators included in n-th group of the N number of groups.

4. The output waveform synthesizer of claim 3, wherein two outputs of the two phase interpolators are used as a single phase clock with independently controllable rise and fall delays.

5. The output waveform synthesizer of claim 1, wherein the 2N number of phase interpolators further configured to adjust at least one of clock overlap periods and phase alignments among the N number of different phase clock signals.

6. The output waveform synthesizer of claim 1, wherein the 2N number of phase interpolators and the eye open monitoring unit are included in a chip including the N-to-1 multiplexer and the clock generator, and the micro controller unit is connected to the 2N number of phase interpolators and the eye open monitoring unit, outside of the chip.

* * * * *